(12) United States Patent
Hatanaka

(10) Patent No.: US 6,229,404 B1
(45) Date of Patent: May 8, 2001

(54) CRYSTAL OSCILLATOR

(75) Inventor: Hidefumi Hatanaka, Kokubu (JP)

(73) Assignee: Kyocera Corporation, Kyoto (JP)

( * ) Notice: Subject to any disclaimer, the term of this patent is extended or adjusted under 35 U.S.C. 154(b) by 0 days.

(21) Appl. No.: 09/387,148

(22) Filed: Aug. 31, 1999

(30) Foreign Application Priority Data

Aug. 31, 1998 (JP) .................................. 10-244277
Aug. 31, 1998 (JP) .................................. 10-244278
Aug. 31, 1998 (JP) .................................. 10-244280

(51) Int. Cl.[7] .............................. H03B 1/00; H03B 5/04; H03B 5/32; H01L 23/12; H01L 41/053

(52) U.S. Cl. ...................... 331/68; 331/66; 331/108 D; 331/158; 257/698; 257/700; 257/704; 257/724; 310/315; 310/318; 361/730; 361/753; 361/820

(58) Field of Search .......................... 331/66, 68, 108 D, 331/158, 175, 176; 310/315, 318, 340, 348; 257/469, 698, 700, 704, 723, 724; 361/728, 730, 753, 820

(56) References Cited

U.S. PATENT DOCUMENTS

| 5,381,039 | * | 1/1995 | Morrison ............................. 257/701 |
| 5,422,615 | * | 6/1995 | Shibagaki et al. ................... 333/246 |
| 5,438,219 | | 8/1995 | Kotzan et al. . |
| 5,500,628 | | 3/1996 | Knecht . |
| 5,796,165 | * | 8/1998 | Yoshikawa et al. ................ 257/728 |
| 5,949,294 | * | 9/1999 | Kondo et al. ......................... 331/68 |

* cited by examiner

Primary Examiner—David Mis
(74) Attorney, Agent, or Firm—Hogan & Hartson, LLP

(57) ABSTRACT

A crystal oscillator in which IC control terminal electrodes for writing temperature compensation data in an IC chip are formed on side surfaces of a main body while being distanced from the top and bottom surfaces of the main body. The IC control terminal electrodes will not be short-circuited with a conductive pattern for sealing the crystal oscillating element on the top surface, and the IC chip will not be destroyed by a welding current which flows when a metal cover is mounted on the top surface. The IC control terminal electrodes will not be short-circuited with other wiring conductors during the soldering to bond the crystal oscillator to a printed circuit board. The compensation data or other data written in the IC chip can be stably maintained, thereby securing a stable operation.

13 Claims, 8 Drawing Sheets

CRYSTAL OSCILLATOR

This application is based on patent application Nos. 10-217291, 10-244277, 10-244278, and 10-244280 filed in Japan, the contents of which are hereby incorporated by references.

BACKGROUND OF THE INVENTION

This invention relates to a crystal oscillator, for example, a crystal oscillator for use in a mobile communications apparatus.

A crystal oscillator of this type is an essential part for generating an oscillator signal for control of signal reception and transmission between mobile communications apparatus or the like. Such a crystal oscillator is required to have a very small volume as the mobile communications apparatus is constructed smaller and to have a reference clock signal having a stable frequency even if being used under an environment where ambient temperature drastically changes.

In response to the request for stabilized frequency, temperature compensation is performed to make the oscillating frequency constant and independent of ambient temperature against the intrinsic temperature-frequency variation characteristic of the crystal oscillator (e.g., an AT-cut crystal oscillating element has a temperature-frequency variation characteristic represented by a three-dimensional curve). In order to conduct this temperature compensation in a small crystal oscillator at a high accuracy, variations in oscillating frequency of a crystal oscillating element which varies with ambient temperature is flattened as a whole by use of an oscillating inverter and an IC (Integrated Circuit) chip capable of sensing a temperature, storing temperature compensation data for specified temperatures, converting the voltage, performing varicap diode function, and performing control. Specifically, oscillating frequency variations are flattened by setting the capacity value of varicap diode performance at a suitable predetermined value based on temperature compensation data.

In recent years, a crystal oscillator provided with a control circuit for compensating a temperature-frequency variation characteristic is welded to a printed circuit board by reflowed solder together with other electronic devices and devices. Accordingly, there have been proposed crystal oscillators formed with external terminal electrodes on a surface of a main body thereof. The conventional crystal oscillator provided with external terminal electrodes is formed with a cavity for accommodating a crystal oscillating element and a control circuit. Specifically, the control circuit including an IC chip is arranged in a lower portion of the cavity and the crystal oscillating element is arranged in an upper portion of the cavity or atop the control circuit. In other words, the both members are placed in the same space. Finally, the cavity is hermetically sealed by a metal cover. However, since the frequency variation characteristic of the crystal oscillating element varies due to deposition of impurities on the surface thereof or other causes, it is desirable to hermetically seal the crystal oscillating element in a space provided specially therefor. Further, it is desired to arrange the IC chip in a location which is not subject to the unnecessary heat.

Japanese Unexamined Patent Publication No. 10-28024 discloses a small crystal oscillator provided with external terminal electrodes on a surface thereof which satisfies the aforementioned demands and is able to highly accurately conduct a temperature compensation. This crystal oscillator includes a plate-like substrate and a rectangular hollow member attached on a bottom surface of the plate-like substrate. The rectangular hollow member has a rectangular space. The plate-like substrate and the rectangular hollow member defines a cavity. A crystal oscillating element is mounted on a top surface of the plate-like substrate while a control circuit is provided on a bottom surface of the plate-like substrate and in the cavity.

More specifically, as shown in FIGS. 11 to 13, the crystal oscillator is mainly comprised of a main body 51, a rectangular crystal oscillating element 52, an IC chip 53 constituting a control circuit and a metal cover 54. In this crystal oscillator is used the main body 51 which is an integral assembly of a plate-like ceramic substrate 55 and a rectangular hollow member 56 attached on the bottom surface of the substrate 55. The rectangular hollow member 56 has a rectangular space. Accordingly, a cavity 57 is defined in a lower portion of the main body 51.

In the ceramic substrate 55 partitioning the top surface of the main body 51 and the ceiling surface of the cavity 57 is formed viahole conductors 58 for electrically connecting the top surface of the main body 51 and the ceiling surface of the cavity 57. Also, a sealing conductive pattern 59 for sealing a gap between the metal cover 54 and the top surface is formed on the top surface of the ceramic substrate 55. A wiring conductor 60 including an electrode pad for a controlling IC is formed on the ceiling surface of the cavity 57. Further, external terminal electrodes 61, 62 (63, 64) are formed on each of, for example, longer sides of the bottom surface of the rectangular hollow member 56. A plurality of recesses extending up to the bottom surface of the ceramic substrate 55 are formed in the opposite shorter sides of the main body 51, and terminal electrodes 65 to 68 are formed on the inner wall surfaces of these recesses. The terminal electrodes 65 to 68 are adapted to write temperature compensation data or other data in the IC chip 53.

The rectangular crystal oscillating element 52 is electrically coupled to the top surface of the main body 51 via electrode pads 69 and 70 using conductive adhesives 71, 72, and the metal cover 54 substantially in the form of a dish is integrally coupled using the sealing conductive pattern 59 in order to hermetically seal the crystal oscillating element 52. A controlling IC chip 53 is mounted in the cavity 57. This IC chip 53 is electrically connected to the electrode pad of the wiring conductor 60 via a bump or a bonding wire. In the cavity 57, resin 73 is filled and cured, so that the IC chip 53 is completely covered to have an improved resistance to humidity. In the aforementioned construction, the crystal oscillating element 52 mounted on the top surface of the main body 51 is connected with the IC chip 53 via the viahole conductors 58. The IC chip 53 and the IC control terminal electrodes 65 to 68 are connected via the wiring conductor 60 extending on the bottom surface of the ceramic substrate 55. Also, the IC chip 53 and the external terminal electrodes 61 to 64 are connected by a viahole conductor extending through the rectangular hollow member 56, or utilizing an inner wall surface of the rectangular hollow member 56.

The crystal oscillator thus constructed is manufactured by the following process.

First, the main body 51, the crystal oscillating element 52, the IC chip 53, etc. are prepared. Subsequently, the crystal oscillating element 52 is mounted on the electrode pads 69, 70 on the top surface of the main body 51, and is hermetically sealed by the metal cover 54. For example, a seam member is placed on the top surface of the main body 51 in advance and the metal cover 54 is placed to be seam-welded. Then, the IC chip 53 is mounted in the cavity 57 in a lower portion of the main body 51. Specifically, the IC chip 53 is bonded to the ceiling surface of the cavity 57 and is connected with the wiring conductor 60 including the IC electrode pad via an gold wire. Subsequently, the resin 73 is filled and cured in the cavity 57. Thereafter, specified temperature compensation data are written in the IC chip 53 using the IC control terminal electrodes 65 to 68 exposed to the outside of the main body 51.

However, in the aforementioned crystal oscillator, the IC chip 53 is required to be supplied with temperature compensation data to flatten a variation in the frequency of the mounted crystal oscillating element 52 in accordance with a temperature-frequency variation characteristic of the crystal oscillating element 52. The temperature compensation data is written in the IC chip 53 during the manufacturing process, and temperature compensation is actually performed after this oscillator is mounted on a printed circuit board. It will be seen that the oscillator does not function as a temperature compensating crystal oscillator at all if the temperature compensation data written in the IC chip 53 is erased or altered after the oscillator is mounted on the printed circuit board.

The IC control terminal electrodes 65 to 68 for writing the data in the IC chip 53 are formed in the opposite sides of the main body 51. More specifically, the terminal electrodes 65 to 68 extend to a bottom of the main body 51. When this oscillator is soldered to a printed circuit board after the temperature compensation data is written in the IC chip 53, accordingly, it is likely to occur that solder adheres to the IC control terminal electrodes 65 to 68 or an unexpected potential applies to the IC control terminal electrodes 65 to 68. Such an event causes the temperature compensation data in the IC chip 53 to be erased or altered. This is because the IC control electrode terminals 65 to 68 are provided in the opposite sides of the main body 51 and extend to the bottom of the main body 51. This problem can be seen to be avoided by providing the IC control terminal electrodes 65 to 68 sufficiently apart from the external terminal electrodes 61 to 64 to be soldered. This results in a larger size of the main body 51 or a largely reduced degree of freedom in a wiring of a printed circuit board to be connected with the oscillator.

In the conventional crystal oscillator, further, the electrode pads 69, 70 are formed on the top surface of the ceramic substrate 55 while the IC electrode pad is formed on the bottom surface of the is constructed as the ceramic substrate 55. The opposite ends of the viahole conductors 58 extending through the ceramic substrate 55 are exposed to the space for accommodating the crystal oscillating element 52 and to the cavity 57, respectively. In the case where there is no gap between the ceramic substrate 55 and the viahole conductors 58, i.e., the inner wall of the viahole or the through hole formed in the ceramic substrate 55 and the peripheral surface of the viahole conductors 58 are completely in close contact, there will be no problem. However, there are the likelihoods that: 1)Cracks occur due to a different thermal shrinkage coefficient between the ceramic substrate 55 and the viahole conductor 58; 2)The viahole conductor 58 is not completely in close contact with the ceramic substrate 55; 3) Even if complete airtight contact is attained before a crystal oscillating element 52 and an IC chip 53 are mounted, hermetic reliability is considerably reduced as result of a plurality of heat treatments, e.g., during mounting of the crystal oscillating element 52, during stabilization of the frequency of the crystal oscillating element 52, during mounting of the IC chip 53, or during the filling and curing of resin 73. Accordingly, there is a likelihood that the airtight space for accommodating the crystal oscillating element 52 communicates with the cavity 57 via undesirable gap or crack around the viahole conductor 58. As a result, the environment of the accommodation space enclosing the crystal oscillating element 52 changes, consequently changing the oscillation characteristic.

Further, according to the manufacturing process of the conventional crystal oscillator, the crystal oscillating element 52 and the IC chip 53 are separated or partitioned by the ceramic substrate 55 of the main body 51, and are separately mounted. However, even if an already mounted crystal oscillating element 52 has an oscillation characteristic which cannot be controlled by a temperature compensating circuit or has an oscillation defect, this improper or defective state cannot be detected until an IC chip 53 is mounted in the cavity 57 in a lower portion of the main body 51 and a measurement is made using the external terminal electrodes 61 to 64. Accordingly, if the crystal oscillating element 52 is improper or defective, the IC chip 53 mounted in the main body 51 also has to be thrown away. This is extremely disadvantageous in terms of cost.

In view of this problem, it may be appreciated to form, on the outer surface of the main body 51, monitor electrode pads for measuring the oscillation characteristic of the crystal oscillating element 52 after the crystal oscillating element 52 is mounted in the main body 51. However, the finally manufactured crystal oscillator has a problem of requiring additional treatment to prevent the monitor electrode pad from receiving unnecessary electric noise from outside after the oscillator is mounted on a printed circuit board.

SUMMARY OF THE INVENTION

It is an object of the present invention to provide a crystal oscillator which has overcome the problems residing in the prior art.

It is another object of the present invention to provide a temperature compensating crystal oscillator in which temperature compensation data stored in an IC chip can be stably maintained and temperature compensation can be stably performed.

It is another object of the present invention to provide a crystal oscillator which can prevent a hermetic space for accommodating a crystal oscillating element from communicating with a cavity for accommodating an IC chip.

It is still another object of the present invention to provide a method for manufacturing a small-sized temperature compensating crystal oscillator which enables measurement of characteristics of a crystal oscillating element mounted in a main body, and can assure a stable oscillation.

It is further another object of the present invention to provide a method for manufacturing a small-sized temperature compensating crystal oscillator which can prevent an IC chip from being wasted, and can maintain a stable operation of the IC chip.

According to an aspect of the invention, a crystal oscillator comprises an insulating main body having upper and lower spaces, a cover for sealing the upper space with a crystal oscillating element accommodated therein, and a resin filled in the lower space with an IC chip accommodated therein, and IC control terminal electrodes to be connected with the IC chip which are formed on a side surface between the top and bottom surfaces of the main body while being distanced from the top and bottom surface of the main body.

In this arrangement, the IC control terminal electrodes to be connected with the IC chip are distanced from both the top and bottom surfaces of the main body, there is no likelihood that they are mistakenly brought into contact with each other during the respective treatments applied to the top and bottom surfaces. Therefore, temperature compensation data written via the IC control terminal electrodes can be stably maintained without being erased or altered, which securely enables a proper temperature compensation.

An inventive method for manufacturing a crystal oscillator, comprises the steps of preparing a main body having upper and lower spaces; mounting a crystal oscillating element in the upper space; measuring an oscillating frequency variation characteristic of the mounted crystal oscillating element for frequency adjustment; hermetically sealing the upper space; mounting an IC chip in the lower space; and writing temperature compensation data used to flatten the temperature-frequency variation characteristic of the crystal oscillating element in the IC chip via IC control terminal electrodes.

According to the above method, the crystal oscillating element is mounted in the upper space before the IC chip is mounted in the lower space. Accordingly, the frequency of the crystal oscillating element can be easily measured and adjusted to an oscillating frequency which can be easily compensated using the temperature compensation data. Further, heat aging or like treatment is applied to stabilize the adjusted frequency of the crystal oscillating element after the crystal oscillating element is mounted. Since this process is carried out prior to the mounting of the IC chip, or this process is carried out in another unit, the number of heat application to the IC chip can be reduced, thereby securing the stable operation of the IC chip.

Further, even if the waste of the entire main body is unavoidable due to the defect of the crystal oscillating element, the IC chip needs not be wasted since it is not mounted yet, and successive unnecessary processes need not be performed. This enables the temperature compensating crystal oscillator to be more inexpensively predicable.

Another inventive method for manufacturing a crystal oscillating element comprises the steps of preparing a first unit including a first space and a second unit including a second space having an opening; hermetically sealing the first space in which a crystal oscillating element is mounted; mounting an IC chip in the second space; bonding the first and second units together such that the opening of the second space of the second unit is covered by the first unit and bonding electrodes are coupled to each other one on top of the other; and writing temperature compensation data.

According to this method, the first and second units can be separately prepared, and are bonded together into a single piece via the bonding electrodes after the crystal oscillating element and the IC chip are mounted in the corresponding units.

These and other objects, features and advantages of the present invention will become more apparent upon a reading of the following detailed description and accompanying drawings.

DETAILED DESCRIPTION OF THE PREFERRED EMBODIMENT OF THE PRESENT INVENTION

Figure 1:
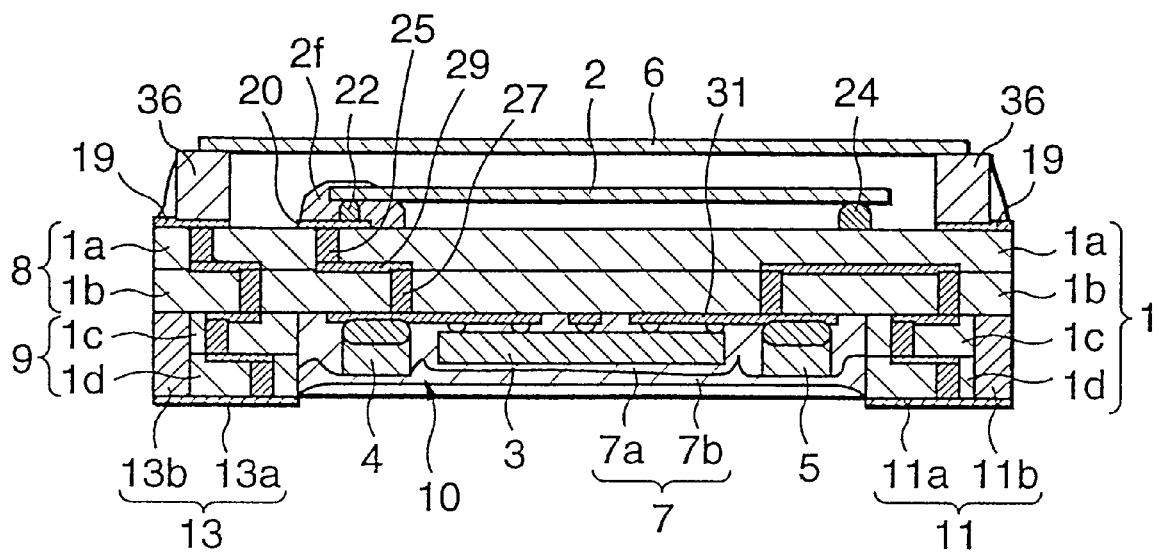
FIG. 1 is a sectional view of a crystal oscillator according to an embodiment of the invention.
Figure 2:
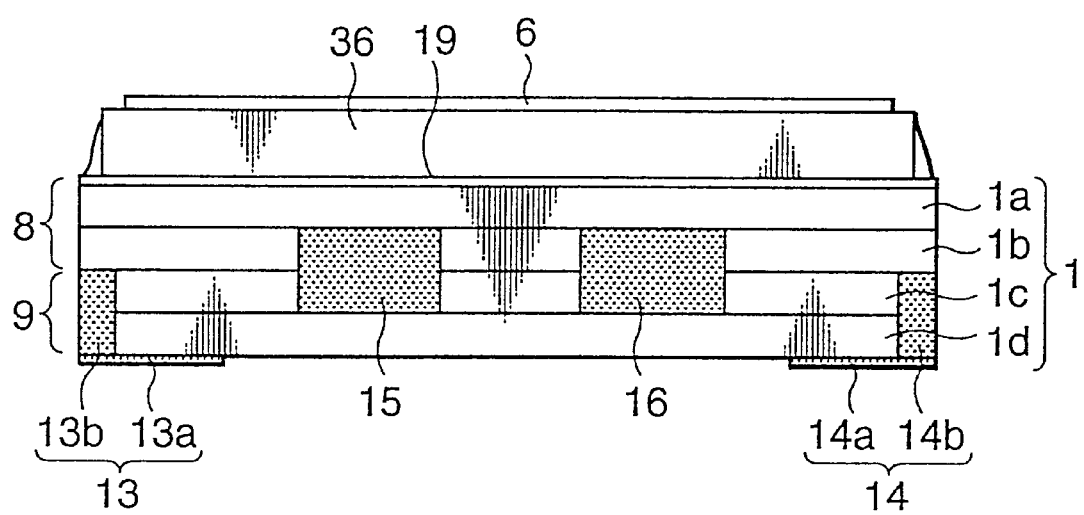
FIG. 2 is a side view of the crystal oscillator shown in FIG. 1.
Figure 3:
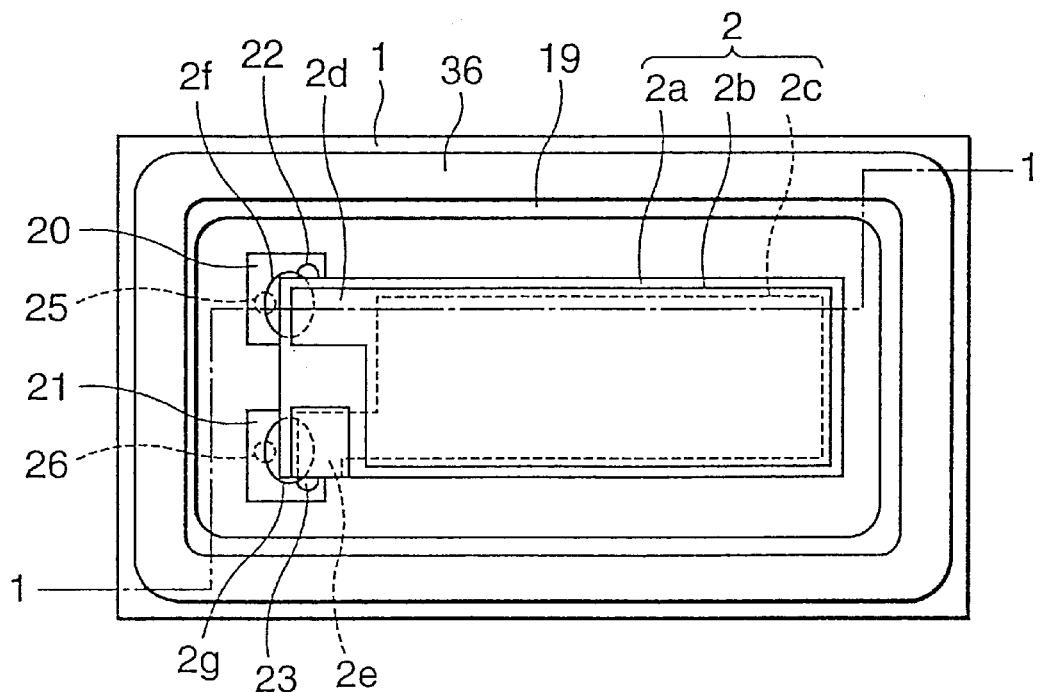
FIG. 3 is a top plan view of the crystal oscillator shown in FIG. 1, a cover of the oscillator being removed.
Figure 4:
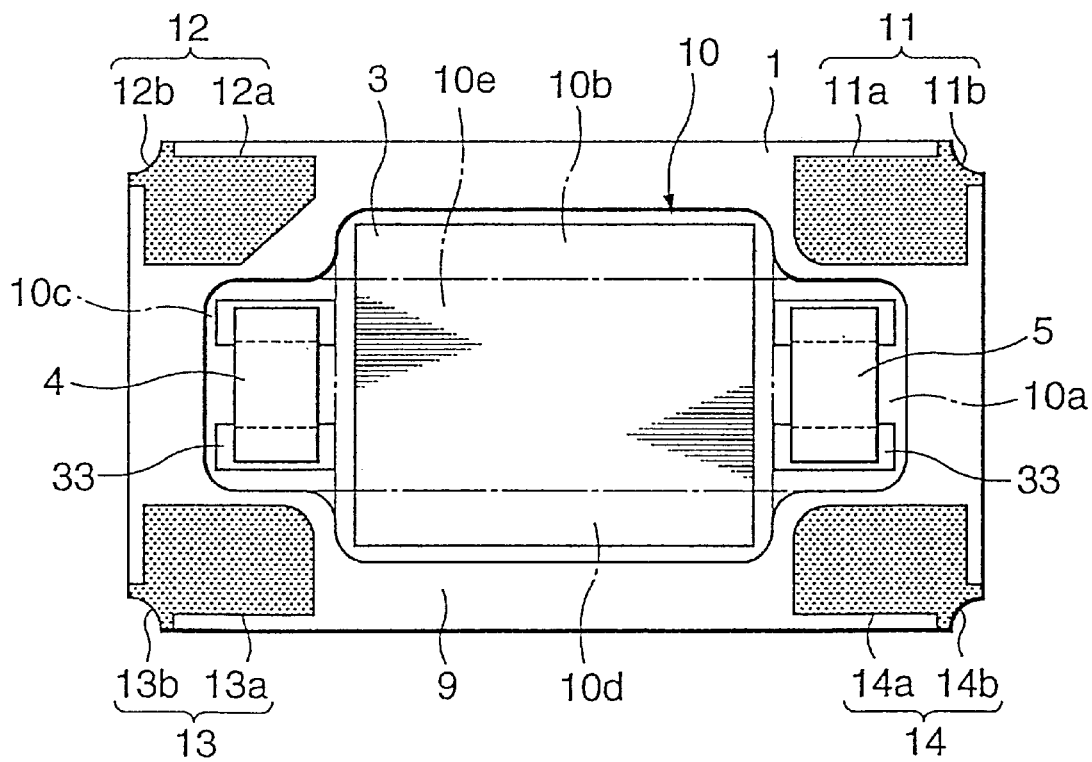
FIG. 4 is a bottom plan view of the crystal oscillator shown in FIG. 1, a covering resin being removed.
Figure 5:
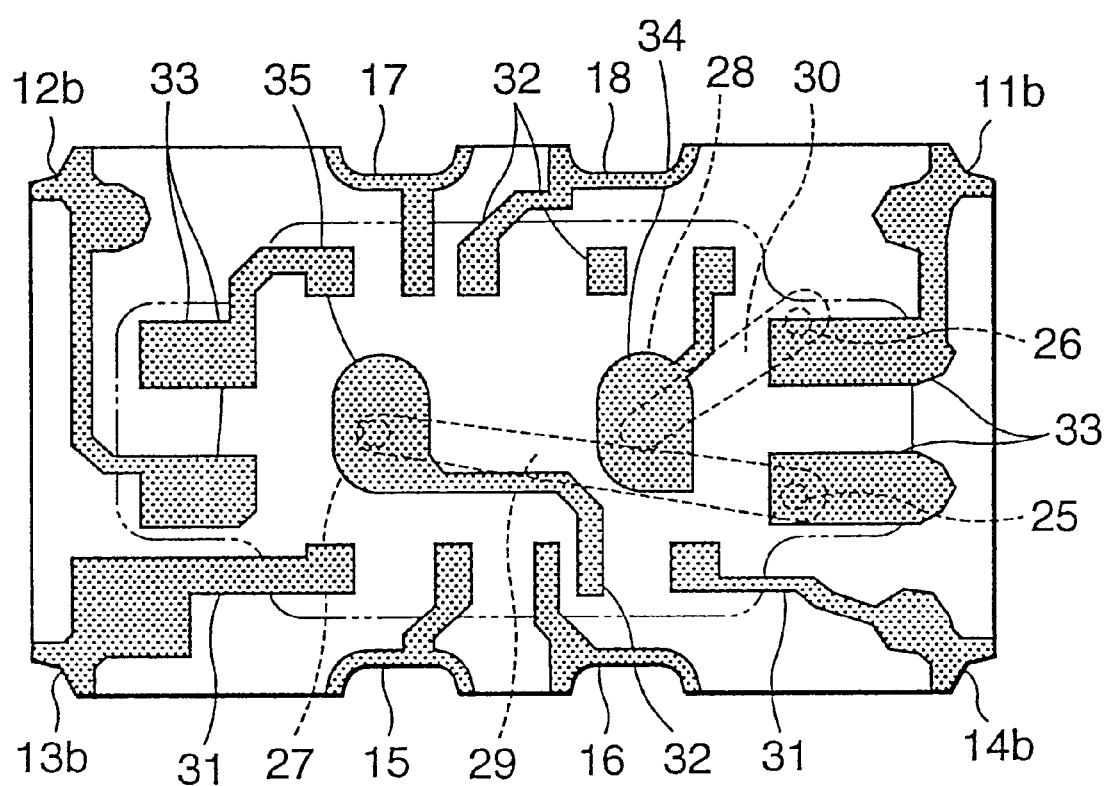
FIG. 5 is a schematic diagram showing an arrangement of wiring conductors provided on a ceiling surface of the cavity and an arrangement of an internal wiring conductors of the crystal oscillator shown in FIG. 1.

A crystal oscillator embodying the invention will be described in detail with reference to the accompanying drawings. FIG. 1 shows a section of a crystal oscillator embodying the invention; FIG. 2 is a side view of the crystal oscillator; FIG. 3 shows a top view of the crystal oscillator without a cover thereof; FIG. 4 shows a bottom view of the crystal oscillator without a covering resin, and FIG. 5 schematically shows an arrangement of wiring conductors in the crystal oscillator. It should be noted that FIG. 1 shows a section taken along the line 1—1 in FIG. 3.

In this embodiment, the compensating crystal oscillator is provided with a control circuit for performing a temperature compensation to flatten a temperature-frequency variation characteristic of a crystal oscillating element.

More specifically, the temperature compensating crystal oscillator is mainly comprised of a substantially box-shaped main body 1, a rectangular crystal oscillating element 2, a controlling IC chip 3 constituting a control circuit, two electronic devices 4, 5, a metal cover 6, and a covering resin 7.

The main body 1 is constructed by placing substantially rectangular ceramic insulating layers 1a, 1b and hollow ceramic insulating layers 1c, 1d one on another integrally. The hollow ceramic insulating layers 1c and 1d each are formed with a peculiar space. The ceramic insulating layers 1a, 1b form a partition 8 for partitioning the crystal oscillating element 2 from the IC chip 3 and the electronic devices 4, 5, whereas the ceramic insulating layers 1c, 1d form a rectangular hollow member 9. A cavity 10 is defined by a bottom surface of the partition 8 and inner walls of the space of the rectangular hollow member 9.

External terminal electrodes 11 to 14 are formed at four corners of the bottom surface of the main body 1. In the opposite longer sides of the main body 1 are formed terminal electrodes 15 to 18 for IC-control to write necessary temperature compensation data and a variety of pieces of information for control in the IC chip 3.

A sealing conductive pattern 19 is formed on the periphery of the top surface of the main body, i.e., the top surface of the partition 8. Oscillating element electrode pads (first electrode pads) 20, 21 to be connected with the crystal oscillating element 2 are arranged side by side near one longitudinal end of the top surface of the main body 1. On the electrode pads 20, 21 are formed connection bumps 22, 23 for spacing the crystal oscillating element 2 from the top surface of the main body 1 by a specified distance. Further, a holding bump 24 for supporting the other end of the crystal oscillating element 2 is formed near the other longitudinal end of the top surface of the main body 1.

The ceramic insulating layer 1a is formed with two first viahole conductors 25, 26 (but first viahole conductor 26 is not shown in FIG. 1) connected with the electrode pads 20, 21, and the ceramic insulating layer 1b is formed with second viahole conductors 27, 28 (but second viahole conductor 28 is not shown in FIG. 1) exposed at the ceiling surface of the cavity 10. Between the layers 1a and 1b are formed internal wiring conductors 29, 30 (but conductor 30 is not shown in FIG. 1) for connecting the viahole conductors 25 and 27 and the viahole conductors 26 and 28. Further, on the bottom surface of the ceramic insulating layer 1b are formed various wiring conductors 31 for connecting the IC chip 3 with the IC control terminal electrodes 15 to 18, for connecting the IC chip 3 with the electronic devices 4, 5 and for connecting the IC chip 3 and the electronic devices 4, 5 with the external terminal electrodes 11 to 14. Further, on the ceiling surface of the cavity 10 are formed IC electrode pads (second electrode pads) 32, element electrode pads 33, monitor electrode pads 34, 35 for individually measuring the oscillation characteristic of the crystal oscillating element 2, which constitute a part of the various wiring conductors 31. The monitor electrode pads 34, 35 are formed in the location where the IC chip 3 is to be mounted.

In the main body 1 are defined two conductive paths each of which has one end on the top surface of the partition 8 and the other end on the ceiling surface of the cavity 10. More specifically, the one conductive path is defined by the first viahole conductor 25, the internal wiring conductor 29, and the second viahole conductor 27. The other conductive path is defined by the first viahole conductor 26, the internal wiring conductor 30, and the second viahole conductor 28. In this way, the oscillating element electrode pads 20, 21 are electrically connected with the IC electrode pads 32, 32 and the monitor electrode pads 34, 35 by the way of the conductive paths and the wiring conductors 31, 31 on the ceiling surface of the cavity 10.

The external terminal electrodes 11 to 14 are comprised of horizontal portions 11a to 14a formed at the four corners of the bottom surface of the main body 1 and vertical portions 11b to 14b, which are formed at inner walls of recesses formed by cutting off a sector of about 90° from the four corners of the ceramic insulating layers 1c, 1d and extend in the thickness direction, respectively. The external terminal electrode 13 at ground potential needs to be connected with the sealing conductive pattern 19 formed on the top surface of the main body 1 to cause the metal cover 6 to have a shielding effect. As shown in FIG. 1, thus, the external terminal potential 13 at ground potential is connected with the sealing conductive pattern 19 by the viahole conductor extending through all the ceramic insulating layers 1a to 1d, and the internal wiring conductors. Alternatively, the vertical portion 13b of the external terminal electrode 13 is extended up to the top surface of the main body 1 so as to connect with the sealing conductive pattern 19.

The IC control terminal electrodes 15 to 18 are formed not in the ceramic insulating layers 1a, 1d, but on the end surfaces of the longer sides of intermediate layer held between the ceramic insulating layers 1a and 1d, i.e., the ceramic insulating layers 1b, 1c. Accordingly, the IC control terminal electrodes 15 to 18 at the side surfaces of the main body 1 are not in contact with the top and bottom surfaces of the main body 1. This is to avoid a short circuit with the sealing conductive pattern 19 formed on the top surface and to avoid a short circuit with wiring conductors on a printed circuit board when the crystal oscillator is soldered to the printed circuit board. It is desirable to form the IC control terminal electrodes 15 to 18 on inner wall surfaces of recesses formed in the longer sides of the ceramic insulating layers 1b, 1c. This prevents an occurrence of an erroneous temperature compensation due to alteration of written data caused by an external factor such as contact of the crystal oscillator with a conveyor for conveying it onto a printed circuit board. Further, this will assure stable contact of a data writing head onto the IC control terminal electrodes 15 to 18.

The main-body 1 is made of ceramic green sheets, which are to become the ceramic insulating layers 1a to 1d. Specifically, through holes for the first viahole conductors 25, 26 are formed in a rectangular ceramic which is a green sheet to become the insulating layer 1a, and metal paste having a high melting point such as molybdenum or tungsten is filled in these through holes. Simultaneously, conductive thin layers to become the electrode pads 20, 21, those to become bumps 22 to 24 and the one to become sealing conductive pattern 19 are formed on the top surface of the main body 1 by printing metal paste.

In a rectangular ceramic which is a green sheet to become the insulating layer 1b are formed through holes for the second viahole conductors 27, 28 and recesses in which the IC control terminal electrodes 15 to 18 are formed. The through holes are filled and conductive thin layers are formed on the inner wall surfaces of the recesses by the aforementioned high melting-point metal paste. Simultaneously, conductive thin layers to become the IC electrode pads 32, the device electrode pads 33, the monitor electrode pads 34, 35 and the internal wiring conductors 29, 30 for connecting electrode pads 32, 33, 34 and 35 with the respective terminal electrodes 11 to 18 to construct a specified circuitry, and the wiring conductors 31, 31 are formed on the surface of this green sheet which serves as the ceiling surface of the cavity 10.

Further, conductive thin layers to become the internal wiring conductors 29, 30 for connecting the first viahole conductors 25, 26 and the second viahole conductors 27, 28 are formed on the joint surface of either of green sheets to serve as the ceramic insulating layers 1a or 1b by printing metal paste.

Notches for the vertical portions 11b to 14b of the external terminal electrodes 11 to 14 and recesses for the IC control terminal electrodes 15 to 18 are formed in a green sheet formed with a space having the peculiar shape. This green sheet is to become the ceramic insulating layer 1c. Conductive thin layers are formed on inner walls of these notches and recesses using metal paste.

Notches for the vertical portions 11b to 14b of the external terminal electrodes 11 to 14 are formed in a green sheet formed with a space having the peculiar shape. This is to become the ceramic insulating layer 1d. Conductive thin layers are formed on inner walls of these notches using metal paste. Simultaneously, Conductive thin layers to become the substantially rectangular horizontal portions 11a to 14a of the external electrode terminals 11 to 14 are formed at the four corners of the bottom surface of this green sheet. It should be noted that the horizontal portions 11a to 14a are so formed as to be connected with the vertical portions 11b to 14b for electrical connection.

Sintering is performed after the respective green sheets thus prepared are stacked one on top of another and pressed together. The degree of evenness of the top surface of the main body 1 and the ceiling surface of the cavity 10 is particularly essential since the crystal oscillating element 2 is mounted on the top surface of the main body 1 and the IC chip 3 is mounted in the cavity 10. In the pressing process, pressing is applied using the top surface of the main body 1 as a reference surface. In order to press the ceiling surface of the cavity 10 at a uniform pressure, an auxiliary filler member may be filled in the cavity 10, or pressing may be applied using a punch having a head fittable in the cavity 10, or the insulating layers 1a, 1b and the insulating layers 1c, 1d may be separately pressed and then adhered together.

Subsequently, nickel plating or gold plating is applied to the external terminal electrodes 11 to 14, the IC control terminal electrodes 15 to 18, the sealing conductive pattern 19, the electrode pads 20, 21, the IC electrode pads 32, the device electrode pads 33, the monitor electrode pads 34, 35 and the various wiring conductors 31 and the bumps 22 to 24 which are exposed to the outside of the main body 1, thereby completing the main body 1.

Accordingly, the viahole conductors 25 to 28 and the internal wiring conductors 29, 30 in the main body 1 are made of high melting-point metal conductors such as molybdenum or tungsten, and the respective terminal electrodes 11 to 18, the sealing conductive pattern 19, the respective electrode pads 20, 21, 32, 33, 34 and 35, and the various wiring conductors 31, which are exposed to the outside of the main body 1, have a multi-layer structure of nickel or gold on the high melting-point metal conductor.

In a case where a connection construction for the external terminal electrode 13 at ground potential and the sealing conductive pattern 19 is comprised of, for example, viahole conductors penetrating through the ceramic insulating layers 1a to 1d and the internal wiring conductors, they may be formed at the same time as the aforementioned viahole conductors 25 to 28 and the wiring conductors 29 to 31. Alternatively, this connecting construction may be realized by a conductive thin layer extending from the vertical portion 13b over a notch formed at one corner of the ceramic insulating layers 1a, 1b. Besides the external terminal electrode 13 at ground potential, in order to connect the external terminal electrode 12, which serves as a VCC terminal having a possibility for a large current to flow therethrough, with the internal wiring conductors 29, 30, it may be appreciated to form a viahole conductor in the ceramic insulating layers 1c, 1d instead of providing the conductor in one corner of the ceramic insulating layers 1c, 1d.

Although the connection bumps 22, 23 and the holding bump 24 are formed at one and the other ends of the electrode pads 20, 21 by printing metal paste on the top surface of the main body 1, they may be formed by applying and depositing conductive paste containing silver powder or by applying and curing resin paste containing silver powder. In order to cause the connection bumps 22, 23 to have a specified height, the paste may be applied a plurality of times. The height from the top surface of the main body 1 to the top of the connection bumps 22, 23 is preferably 15 to 20 $\mu$m, and the height from the top surface of the main body 1 to the top of the holding bump 24 is smaller than the height of the connection bumps 22, 23, preferably by 5 to 10 $\mu$m.

A seam member which is a substantially rectangular metal frame is bonded to the sealing conductive pattern 19. The seam member 36 is made of Fe—Ni alloy, Fe—Ni—Co alloy, or phosphor bronze, etc., and has a construction in conformity with the configuration of the sealing conductive pattern 19. The seam member 36 is bonded to the sealing conductive pattern 19 by wax.

The crystal oscillating element 2 is arranged on the top surface of the above-prepared main body 1. The crystal oscillating element 2 is comprised of oscillation electrodes 2b, 2c formed on both principle surfaces of a rectangular crystal plate 2a, e.g., an AT-cut, and lead electrodes 2d, 2e in the form of projections extending from the oscillation electrodes 2b, 2c to the other end. It should be noted that the oscillation electrodes 2b, 2c on the bottom surface are indicated by the broken lines in FIG. 3. The lead wires 2d, 2e are connected with the electrode pads 20, 21 via conductive adhesives 2f, 2g.

The oscillation electrodes 2b, 2c and the lead electrodes 2d, 2e are made by forming base layers of chrome or nickel on the opposite surfaces of the crystal plate 2a and top layers of conductive material such as silver or gold by deposition, spattering or other thin layer formation technique.

The crystal oscillating element 2 mounted on the top surface of the main body 1 is hermetically sealed by the metal cover 6. The metal cover 6 is made of a metal material such as Fe—Ni—Co alloy or Fe—Ni alloy, and has a specified thickness, e.g., 0.1 mm. The metal cover 6 is brought into close contact with and welded with the seam member 36 bonded to the sealing conductive pattern 19 on the top surface of the main body 1 by wax. Nickel, aluminum or the like is deposited on an outer principle surface of the metal cover 6 in order to prevent melted wax from flowing onto the outer principle surface of the metal cover 6 during welding, thereby realizing stable and strong welding.

The IC chip 3 constituting the control circuit is mounted on the ceiling surface of the cavity 10 of the main body 1. The IC chip 3 performs such a control as to flatten a variation in the frequency of the crystal oscillating element 2, which is due to an intrinsic temperature-frequency variation characteristic represented by, e.g., a three-mode curve, over a wide temperature range including the normal temperature. Specifically, the IC chip 3 is made by treating a silicon chip by known PN doping. The IC chip 3 includes an oscillating inverter constructing an oscillating circuit, a load capacitor, a feedback resistance, a memory for storing temperature compensation data necessary to flatten the intrinsic temperature-frequency variation characteristic of the crystal oscillating element 2, a temperature sensor for detecting ambient temperature, a varicap diode, a digital-to-analog (D/A) converter for conversion into a specified voltage based on specific temperature compensation data, an analog-to-digital (A/D) converter for converting a write signal from outside into digital data so as to be stored in the memory, and a processor for controlling the operations of the above devices.

The IC chip 3 includes a VCC terminal to which a supply voltage is supplied, a GND terminal which is at ground potential, two crystal oscillation input/output terminals to be connected with the crystal oscillating element 2, an OUT terminal for oscillation output, a VCON terminal for enabling frequency adjustment from outside, and four temperature compensation data writing control terminals 15 to 18 for writing the compensation data.

The VCC terminal (power supply) of the IC chip 3 is electrically connected with the external terminal electrode 12 via the IC electrode pad 32, the wiring conductor 31, and the internal wiring conductors. The OUT terminal is electrically connected with the external terminal electrode 11 via the IC electrode pad 32, the wiring conductor 31, and the internal wiring conductors. The GND terminal is electrically connected with the external terminal electrode 13 via the IC electrode pad 32, the wiring conductor 31, and the internal wiring conductors. The VCON terminal is electrically connected with the external terminal electrode 14 via the IC electrode pad 32, the wiring conductor 31, and the internal wiring conductors. Further, two crystal oscillation input/ output terminals are respectively electrically connected with the electrode pads 20, 21 on the top surf ace of the main body 1 via the IC electrode pads 32, the wiring conductors 31, the monitor electrodes 34, 35, and the conductive paths. The four data writing control terminals are respectively electrically connected with the IC control terminal electrodes 15 to 18 via the IC electrode pads 32 and the wiring conductor 31, and the internal wiring conductors.

These terminals are formed, for example, as aluminum electrodes on the mounting surface of the IC chip 3. The IC chip 3 is mounted in the cavity 10 as follows. Bumps of gold, solder or like material are formed on the respective aluminum electrodes, and are bonded and connected with the aforementioned IC electrode pads 32 by ultrasonic bonding or using conductive filler. Alternatively, the respective aluminum electrodes are formed on the upper surface of the IC chip 3, and then connected with the corresponding IC electrode pads 32 via, for example, bonding wires.

The electronic devices 4, 5 are, for example, electronic devices such as chip-shaped capacitors. They are joined between the pair of device electrode pads 33, 33 using conductive resin adhesive containing silver powder or solder.

The electronic device 4 or capacitor is electrically connected between the IC chip 3 and the VCC external terminal electrode 12 in such a way that one end thereof is at ground potential. This is to remove high-frequency noise to be added onto a power supply voltage supplied to the VCC external terminal electrode 12.

The electronic device 5 or capacitor is electrically connected between the IC chip 3 and the OUT external terminal electrode 11. This is to remove direct-current components which become noise in an output signal.

In the cavity 10, the IC chip 3 and the two electronic devices 4, 5 are so juxtaposed as to minimize the mounting space in conformity with the shape of the cavity 10.

In the cavity 10 is filled the resin 7 in order to strongly bond the IC chip 3 and the electronic devices 4, 5 and to improve reliability in resistance to humidity. For example, the resin 7 is made of at least two kinds of resins and is comprised of a resin layer 7a filled and cured at the bottom of the cavity 10 and a resin layer 7b filled and cured on the resin layer 7a. Specifically, the resin layer 7a is made of a resin material having a relatively large coefficient of shrinkage and containing a large quantity of resin components such as epoxy resin generally called underfill resin. This resin layer 7a is formed by filling and curing to the extent that it completely covers at least the upper surface of the IC chip 3.

More specifically, the IC ship 3 and the electronic devices 4, 5 can be more strongly bonded by a stress produced by the expansion and shrinkage of the resin layer 7a filled between them and the ceiling surface of the cavity 10. Further, a stress produced by the expansion and shrinkage of the resin layer 7a formed to completely cover the IC chip 3 acts on the IC chip 3. This stress acts to press the IC chip 3 against the ceiling surface of the cavity 10 from above the IC chip 3, thereby improving the bonding strength of the IC chip 3 to the ceiling surface of the cavity 10.

The resin layer 7b is formed to solve problems of, e.g., insufficient resistance to humidity which are caused by the thinning of the resin layer 7a for covering the IC chip 3 and the electronic devices 4, 5 due to its large shrinkage stress. By the resin layer 7b, the IC chip 3 and the electronic devices 4, 5 mounted in the cavity 10 are allowed to have a better bonding strength and better reliability in resistance to humidity.

The resin 7 should not project out through the opening plane of the cavity 10 in order to stably place the temperature compensating crystal oscillator on the printed circuit board.

In the crystal oscillator thus constructed, only the IC chip 3 and the two electronic devices 4, 5 are mounted in the cavity 10 in the lower portion of the main body 1 as shown in FIG. 4 in which the resin 7 is omitted.

In FIG. 4, the IC chip 3 is larger than the two electronic devices 4, 5 in plan view. The crystal oscillator is characterized in the arrangement of the IC chip 3 and the two electronic devices 4, 5 to minimize the mounting space and the bottom construction of the main body 1, i.e., the shape of the space of the cavity 10 and the arranged positions of the external terminal electrodes 11 to 14.

For arrangement of IC chip and electronic devices each having a rectangular shape in a minimized space, it would be usually considered to form the accommodation space into a rectangular shape. However, if the rectangular cavity is merely formed to accommodate rectangular IC chip and electronic devices as in the prior art, there will be the problem that the position and the size of external terminal electrodes to be provided around the cavity are restricted. This compels the bottom area of the main body to be increased or the external electrode terminals to be reduced in size.

In view of this problem, in this embodiment, the IC chip 3 and the electronic devices 4, 5 are mounted in the cavity 10 in such a way that the IC chip 3 larger in plan view is in the middle and the. electronic devices 4, 5 smaller in plan view are arranged around or at the sides of the IC chip 3.

Specifically, the electronic device 4, the IC chip 3 and the electronic device 5 are arranged along a center line of the main body 1 with respect to its width (the line extending transversely of FIG. 4). Since the electronic devices 4, 5 are smaller comparing with the IC chip 3, the electronic devices 4, 5 and the IC chip 3 form a substantially cross-like shape as a whole. For this reason, in this embodiment, the space of the cavity 10 is the peculiar shape of a substantially cross in plan view so as to be similar to the arrangement of the electronic devices 4, 5 and the IC chip 3.

The cavity 10 having the substantially cross-shaped space is formed in the rectangular lower portion of the main body 1, and the external terminal electrodes 11 to 14 are arranged at four corner portions of the main body 1 defined between the rectangular bottom surface of the main body 1 and the cross-shaped cavity 10.

In FIG. 4, the cavity 10 has a bulging portion 10a in the bottom surface area between the two adjacent external terminal electrodes 11 and 14, and the electronic device 5 is mainly arranged in the bulging portion 10a. The cavity 10 also has a bulging portion 10c in the bottom surface area between the two adjacent external terminal electrodes 12 and 13, and the electronic device 4 is mainly arranged in the bulging portion 10c.

Further, the cavity 10 has bulging portions 10b, 10d in the bottom surface area between the two adjacent external terminal electrodes 11 and 12 and that between the adjacent external terminal electrodes 13 and 14. A pair of opposite side portions of the IC chip 3 are arranged in these bulging portions 10b, 10d. In this way, the whole space of the cavity 10, i.e., the space consisting of a center portion 10e and the four bulging portions 10a to 10d is minimized more greatly.

As described above, on the rectangular bottom surface of the main body 1 shown in FIG. 4, the IC chip 3 and the electronic devices 4, 5 are mounted in the cross-shaped cavity 10 including the four bulging portions 10a to 10d and the center portion 10e, and the external terminal electrodes 11 to 14 are arranged on the four corner portions which are dead space of the cross-shaped cavity 10. Thus, no space is wasted in the entire bottom surface of the main body 1, and the mounting area of the main body 1 on a printed circuit board can be remarkably made smaller.

In the conventional crystal oscillator, only an IC chip is mounted as a circuit for controlling the oscillation in the cavity of the main body for miniaturization. However, in this embodiment, the electronic devices 4, 5 or capacitors having a large capacity difficult to be integrated on an IC chip can also be mounted in the cavity 10 of the main body 1. Thus, the temperature compensating crystal oscillator according to this embodiment can have a reduced number of electronic devices to be mounted on a printed circuit board, realize easier wiring, contribute to the miniaturization required for mobile communications apparatus or the like, and be very easily handled.

The crystal oscillating element 2 is singly arranged in the hermetic space enclosed by the top surface of the main body 1, the seam member 36 and the metal cover 6, and the IC chip 3 is mounted in the space of the cavity 10 formed in the main body 1. In other words, the crystal oscillating element 2 and the IC chip 3 are arranged in completely different areas. Since the working environment of the crystal oscillating element 2 does not change with time, it can stably operate. Further, since the crystal oscillating element 2 and the IC chip 3 are placed one over the other in the thickness direction of the oscillator with the partition 8 of the main body 1 therebetween, the mounting area of this oscillator on a printed circuit board can be made smaller.

Further, in this embodiment, the monitor electrode pads 34, 35 connected with the crystal oscillating element 2 via the conductive paths formed in the cavity 10, in other words, the monitor electrode pads 34, 35 are not exposed to the outside of the main body 1. Accordingly, unnecessary electric noise, electric impact or shock or stray capacity are not applied from the outside after the crystal oscillator is bonded onto the printed circuit board, with the result that the stable operation of the crystal oscillating element 2 can be maintained. Further, the monitor electrode pads 34, 35 are covered by the IC chip 3 as shown in FIGS. 1 and 4, thereby preventing stray capacity from occurring between the printed circuit board and the monitor electrode pads 34, 35. This will increase the degree of freedom in designing wiring conductors on the printed circuit board.

Next, assembly of the temperature. compensating crystal oscillator will be described with reference to a flow diagram of FIG. 6.

Figure 6:
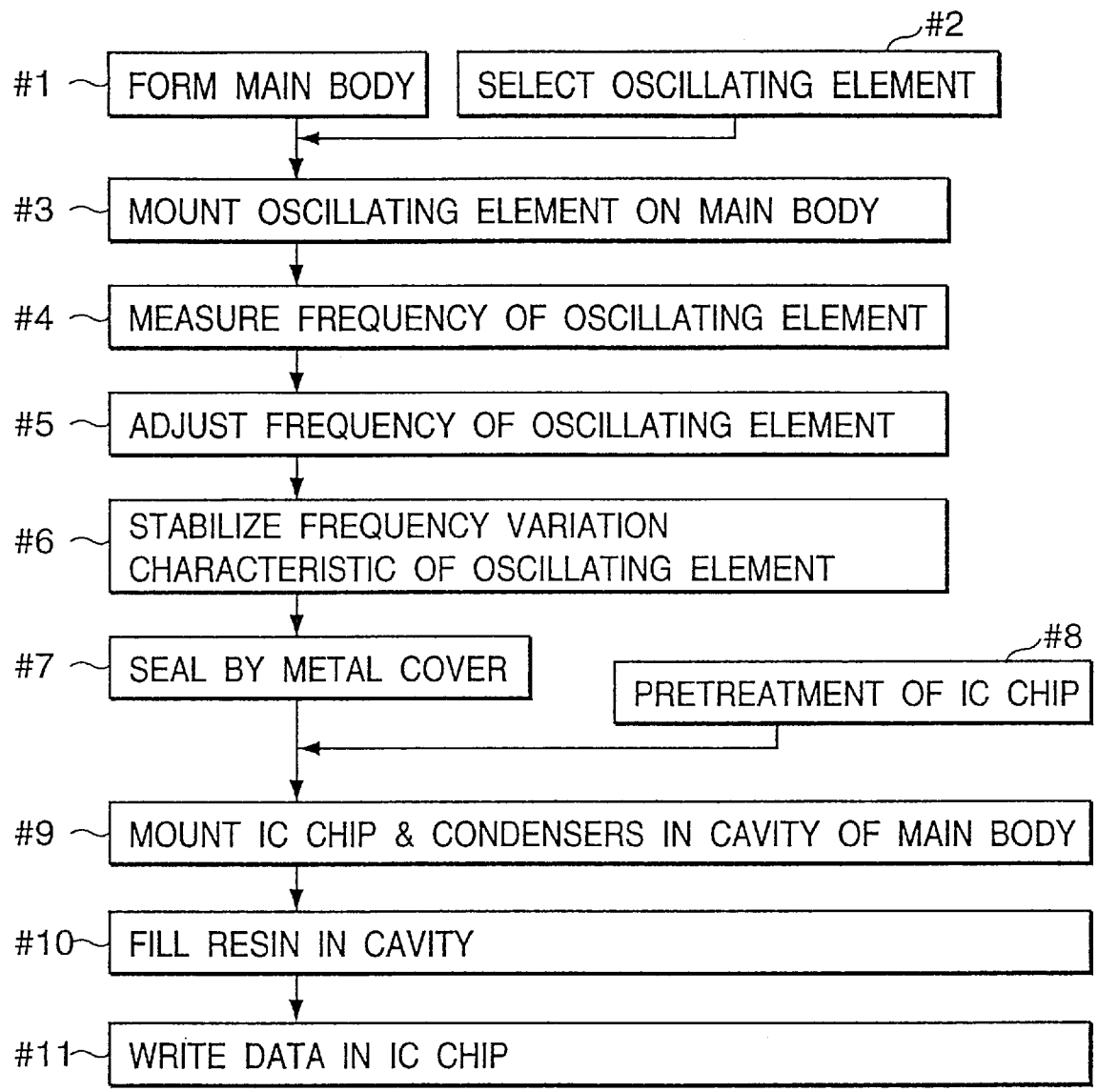
FIG. 6 is a flow diagram showing a process for manufacturing the crystal oscillator shown in FIG. 1.
Figure 7:
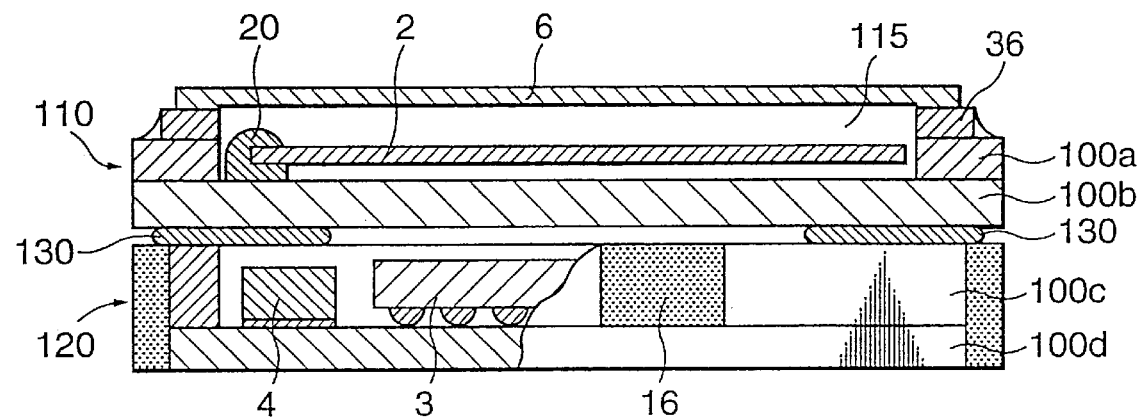
FIG. 7 is a partly sectional view of a crystal oscillator according to another embodiment of the invention.

First, the main body 1 is formed in Step #1 of FIG. 6. The detailed construction and forming of the main body 1 are as described above. On the top surface of the main body 1, the seam member 36 is bonded by wax and the bumps 22, 23 are formed on the crystal oscillation electrode pads 20, 21.

Further, gold bumps are formed on the respective input/output portions of the aluminum electrodes on the mounting surface of the IC chip 3.

A crystal oscillating element 2 is selected in Step #2. Specifically, the frequency variation characteristic of the crystal oscillating element 2 is largely changeable by a small change in cutting angle. Crystal oscillating elements are selected based on whether they can be temperature-compensated by the IC chip 3 and ranked according to their frequency variation.

A selected good crystal oscillating element 2 having a specified satisfactory characteristic is mounted on the top surface of the main body 1 in Step #3. Specifically, the crystal oscillating element 2 is positioned and placed such that the connection bumps 22, 23 formed on the electrode pads 20, 21 on the top surface of the main body 1 are aligned with the lead electrodes 2d, 2e of the crystal oscillating element 2, and the lead electrodes 2d, 2e and the electrode pads 20, 21 are electrically connected to each other using the conductive adhesives 2f, 2g containing silver powder. The bottom surface of the crystal oscillating element 2 at the other end is bonded by being placed on the holding bump 24. On the one end of the crystal oscillating element 2, shrinkage stress acts during the curing of the conductive adhesives 2f, 2g, thereby lifting the other end or the leading end of the crystal oscillating element 2. As a result, a clearance corresponding to the height of the connection bumps 22, 23 is formed between this end of the element 2 and the top surface of the main body 1.

Accordingly, the oscillation electrodes 2b, 2c of the crystal oscillating element 2 are connected with the wiring conductors 31 and the monitor electrode pads 34, 35 formed on the ceiling surface of the cavity 10 via the electrode pads 20, 21, the first viahole conductors 25, 26, the internal wiring conductors 29, 30 and the second viahole conductors 27, 28.

The frequency of the crystal oscillating element 2 is measured in Step #4. Specifically, measuring terminals or probes of a frequency meter are brought into contact with the monitor electrode pads 34, 35 formed on the ceiling surface of the cavity 10, and the crystal oscillating element 2 is caused to oscillate in a specific manner for the frequency measurement.

The frequency of the crystal oscillating element 2 is adjusted in Step #5. Specifically, the adjustment of oscillation frequency is performed by substantially changing the mass of the oscillation electrode 2b on the upper surface of the element 2 bonded to the main body 1 by depositing metal such as silver thereon. In this frequency adjustment, frequency at normal temperature is, for example, set as a required frequency to facilitate the temperature compensation by the IC chip 3. By doing so, the reliability of the temperature compensation by the IC chip 3 can be improved. Further, the amount of data for temperature compensation can be remarkably reduced by stabilizing the temperature-frequency variation characteristic of the crystal oscillating element 2 as above This in turn enables the memory for storing data to have a smaller capacity, which is advantageous in miniaturization and low-cost production of the IC chip 3.

Depending on the construction of the deposition apparatus, the frequency measurement of the crystal oscillating element 2 in Step #4 and the frequency adjustment thereof in Step #5 can be simultaneously performed. Also, the oscillation frequency can be adjusted by reducing the thickness of the oscillation electrode 2b to change its mass by means of ion etching or the like.

The temperature-frequency variation characteristic may be measured as follows. The frequency is measured at a plurality of temperature points (number necessary to determine all coefficients of a cubic function in the case that the temperature-frequency variation characteristic can be represented by the cubic function) while successively changing ambient temperature, and a characteristic function is obtained from the measurement results.

Next, the temperature-frequency variation characteristic of the crystal oscillating element 2 is stabilized by annealing in Step #6. Specifically, heating is applied at 150° C. to 250° C. to the entire main body 1 bonded with the crystal oscillating element 2. This heat treatment is generally called "heat aging". By this heat aging, substance deposited on the oscillation electrode 2b for the frequency adjustment is stabilized, and impurities such as solvent contained in the conductive paste are volatilized. In this way, the frequency of the crystal oscillating element 2 is stabilized. More specifically, the impurities such as solvent contained in the aforementioned conductive paste are volatilized lest environment around the crystal oscillating element 2 should change over time, thereby stabilizing the oscillation of the crystal oscillating element 2 over a long period of time.

This process is performed before the metal cover 6 is mounted to cause the impurities to completely volatilize to the outside from the accommodation space of the crystal oscillating element 2 and also before the IC chip 3 is mounted in the cavity 10 to maximally reduce the number of heat application which reduces the reliability of the operation of the IC chip 3. Thus, the reliability of the operation of the IC chip 3 can be simultaneously improved. It should be noted that the frequency characteristic stabilization must be performed particularly in the case where metal is deposited on the oscillation electrode 2b in the frequency adjustment.

The crystal oscillating element 2 is covered and sealed by the metal cover 6 in Step #7. Specifically, the metal cover 6 is placed on the seam member 36, and a roller electrode (not shown) for seam-welding is moved around the metal cover 6 in contact therewith while applying a welding current, thereby welding the seam member 36 and the metal cover 6 together.

At this time, the accommodation space for the crystal oscillating element 2 enclosed by the top surface of the main body 1, the seam member 36 and the metal cover 6 is caused to have a specified atmosphere. By applying heat aging again if desired thereafter, the accommodation space is kept at the specified atmosphere. After the completion of this process, it is desirable to measure the final oscillating characteristic of the crystal oscillating element 2 accommodated in the hermetic space by the monitor electrode pads 34, 35 formed on the ceiling surface of the cavity 10. This measurement result is used as judgment criteria as to which temperature compensation data to be written in the data writing stage of the final process.

Next, pretreatment for the IC chip 3 is performed in Step #8. This pretreatment can be omitted depending upon the bonding method of the IC chip 3. Since the IC chip 3 is electrically connected to the IC electrode pads 32 on the ceiling surface of the cavity 10 via the bumps in this embodiment, the bumps are formed in this process. For example, gold bumps are formed on the aluminum electrodes at the input/output portions of the mounting surface of the IC chip 3, using gold wires or the like. If heat is applied at high temperature with the gold bumps formed on the aluminum electrodes, Kirkendall void effect occurs due to a difference in diffusion velocity between aluminum and gold, whereby connection strength is reduced at the joint surface of aluminum and gold. However, such a problem does not occur according to this embodiment since the heat aging treatment has already been completed.

The IC chip 3 and the electronic devices 4, 5 are mounted in the cavity 10 in Step #9. Specifically, the electronic devices 4, 5 are bonded by applying the conductive resin paste containing silver powder or the like to the device electrode pads 33, placing the electronic devices 4, 5, and curing the conductive paste to harden it.

The IC chip 3 is mounted as follows. The IC chip 3 is placed after being positioned such that the respective gold bumps are aligned with the respective IC electrode pads 32. Subsequently, ultrasonic waves or the like are applied to the IC chip 3 to fuse the gold bumps and the pads 32 to adhere them to each other.

If avoidance of application of heat produced during the curing to the IC chip 3 is desired, the IC chip 3 may be mounted after the electronic devices 4, 5 are mounted.

Alternatively, the IC chip 3 and the electronic devices 4, 5 may be simultaneously bonded by solder reflowing. In the case that the IC chip 3 is bonded after the electronic devices 4, 5 are bonded, it is desirable to clean the joint surfaces of the IC electrode pads 32 and the space of the cavity 10 by nitrogen gas plasma before bonding the IC chip 3 on the IC electrode pads 32.

Next, resin is filled and cured to cover the IC chip 3 and the electronic devices 4, 5 in Step #10. Specifically, the IC chip 3 and the electronic devices 4, 5 placed in the cavity 10 are completely covered in their entirety by resin generally called underfill, which is then cured to form the resin layer 7a. Subsequently, epoxy resin having an excellent resistance to humidity is filled and cured on the resin layer 7a to form the resin layer 7b. The resin 7 may have a laminated structure in this way.

By this process, bonding strength which is only about 60g per bump can be greatly increased by particularly covering the upper surface of the IC chip 3 by the underfill.

Temperature compensation data is written in the IC chip 3 in Step #11. In other words, the temperature-frequency variation characteristic of the crystal oscillating element 2, which is determined in advance by the frequency adjustment process in order to cause the crystal oscillator to perform a predetermined operation, is inputted in the memory of the IC chip 3 as temperature compensation data for making the temperature-frequency variation characteristic independent of temperature over a wide temperature range including the normal temperature using the IC control terminals 15 to 18. Specifically, the specified data is written by bringing, for example, a head of a writing apparatus into contact with the IC control terminals 15 to 18 formed on the inner walls of the recesses formed in the sides of the main body 1.

The temperature compensation data is data operable to define a function which enables a frequency variation characteristic having three mode frequencies within a predetermined temperature range (e.g., −30° C. to 85° C.) to be stabilized by a frequency at a reference temperature (e.g., 25° C.). Such function makes it possible to eliminate the operation of preparing compensation data for each point of a specified compensable temperature range. Also, such function enables input of data in a series, thereby reducing the number of terminals.

If necessary, the frequency compensation in response to a temperature change is confirmed based on the written compensation data. If the data needs to be corrected again, compensation data after the correction may be written.

This temperature compensation is, for example, a correction of a deviation of the oscillating frequency of the crystal oscillating element 2 at a specific temperature from the reference frequency by adjustment of the capacity of the varicap diode. The temperature compensation data is data for properly setting the capacity of the varicap diode which corrects the frequency deviation based on the ambient temperature detected by the temperature sensor. Therefore, the intrinsic temperature-frequency variation characteristic of the crystal oscillating element 2 can be flattened over a wide temperature range including normal temperature.

In the above flow, the crystal oscillating element 2 is mounted in Step #1 and its frequency is measured and adjusted in Steps #5 to #6, and stabilized by the heat aging treatment. Subsequently, after the crystal oscillating element 2 is sealed in Step #7, the IC chip 3 is mounted in the cavity 10 in Step #9. Thus, heat applying processes necessary to stabilize the oscillating frequency variation characteristic of the element 2 are already completed at latest before the IC chip 3 is mounted. The number of heat application to the IC chip 3 can be reduced. As a result, the reliability of the operation of the IC chip 3 can be improved.

The order of mounting can suppress an occurrence of Kirkendall void effect at the joint portions of the aluminum electrodes of the IC chip 3 with the gold bumps, thereby realizing a stable operation of the IC chip 3 and a strong joint.

Before the IC chip 3 is mounted, the oscillation characteristic of the crystal oscillating element 2 mounted on the main body 1 can be measured by the monitor electrode pads 34, 35 formed on the ceiling surface of the cavity 10. The monitor electrode pads 34, 35 are to be covered by the IC chip 3. Depending on the measurement result, accordingly, the main body 1 can be thrown away with only the crystal oscillating element 2 mounted. This prevents a wasteful consumption of IC chips 3, eliminates unnecessary operations from the entire manufacturing process, and therefore provides a very inexpensive manufacturing process.

Before data necessary for the temperature compensation is written, an intrinsic oscillation characteristic (frequency variation characteristic) of the crystal oscillating element 2 mounted on the main body 1 is measured using the monitor electrode pads 34, 35 formed on the ceiling surface of the cavity 10. Thus, data necessary for the temperature compensation can be recognized in advance and the data writing process can be very efficiently performed.

Although the IC chip 3 is connected with the IC electrode pads 32 of the main body 1 by ultrasonic fusion using bumps in this embodiment, it may also be done using conductive adhesive or using bonding wires by forming the input/output portions on the upper surface of the IC chip 3. In such a case, it is preferable to avoid the usage of resin having a large shrinkage coefficient for the resin 7. This is to prevent the wires from being slanted by shrinkage stress. In other words, even in this embodiment, the resin 7 may be made of one kind of resin focusing mainly on resistance to humidity without having a multi-layer structure, provided that the resin can bond the IC chip 3 with a sufficient strength in the cavity 10.

Although the partition 8 of the main body 1 has a multi-layer structure, it may be made of a single plate provided that the accommodation space for the crystal oscillating element 2 and the another space (i.e., cavity 10) for the IC chip 3 can be completely prevented from communicating with each other. It is essential to arrange the IC control terminal electrodes 15 to 18 so as not to expose on the top and bottom surfaces of the main body 1. Accordingly, the rectangular hollow member 9 is so formed as to have a multi-layer structure.

Further, in the temperature compensating crystal oscillator, the external terminal electrodes 11 to 14 are arranged on the bottom surface of the main body 1 and the IC control terminal electrodes 15 to 18 are arranged on the side surfaces of the main body 1. Accordingly, the bottom surface of the main body 1 can be used only for the external terminal electrodes 11 to 14 and the cavity 10, with the result that the oscillator can be made smaller as a whole.

As shown in FIG. 2, the IC control terminal electrodes 15 to 18 are formed on the side surfaces of the main body 1 where the ceramic insulating layers 1a and 1d are not located. The ceramic insulating layer 1a on the top of the main body 1 is avoided to prevent a short circuit between the IC control terminal electrodes 15 to 18 and the sealing conductive pattern 19. If a short circuit would occur between the IC control terminal electrodes 15 to 18 and the sealing conductive pattern 19, with the result that the temperature compensation data cannot be written and the IC chip 3 is liable to malfunction.

The reason why the ceramic insulating layer 1d on the bottom of the main body 1 is not formed with the electrodes 15 to 18 is to prevent a short circuit between the electrodes 15 to 18 and the external terminal electrodes 11 to 14, and wiring conductors on a printed circuit board.

As shown in FIG. 2, the IC control terminal electrodes 15 to 18 are formed by forming recesses, which have a semi-circular cross section and extend along the thickness direction of the main body 1, in the longer sides of the remaining ceramic insulating layers 1b, 1c held between the ceramic insulating layers 1a, 1d on the top and bottom, and applying the high melting-point metal paste on the inner wall surfaces of the recesses.

Specifically, the IC control terminal electrodes 15 to 18 are actually recessed from the surface of the longer sides. With such an arrangement, even if conductive foreign matter comes to the IC control terminal electrodes 15 to 18 due to an external cause, it is unlikely to touch the IC control terminal electrodes 15 to 18. Accordingly, the temperature compensation data stored in the IC chip 3 can be stably maintained and malfunction of the IC chip 3 can be prevented. Also, the temperature compensation data writing head can be made to come in contact with the IC control terminal electrodes 15 to 18 without any foreign matter therebetween.

A crystal oscillator including only external terminal electrodes 11 to 13 at three corners of the bottom surface of the rectangular main body 1 without an external terminal electrode 14 is also embraced by the scope of the present invention.

In the case that a main body 1 is constructed by three or more layers, at least one ceramic insulating layer is held between those on the top and bottom. Using the sides of this intermediate ceramic insulating layer, IC control terminal electrodes 15 to 18 which do not reach the top and bottom surface of the main body 1 can be formed on the side of the main body 1.

Further, in the case that the number of ceramic insulating layers stacked one on top of another is large, the IC control terminal electrodes 15 to 18 may be formed on any desired ceramic insulating layer(s) located in intermediate position(s).

In the foregoing embodiment, the ceramic insulating layers 1a, 1b and the hollow ceramic insulating layers 1c, 1d are integrally stacked one on top of another in advance to form the main body 1. As shown in FIGS. 7 to 10, however, a first unit formed by an integral body of ceramic insulating layers 1a and 1b, and a second unit formed by an integral body of hollow ceramic insulating layers 1c, 1d may be separately prepared in the forming step (corresponding to Step #1 in FIG. 6).

In this crystal oscillator having the two units, in the steps of selecting an oscillating element 2, mounting the oscillating element 2, measuring the frequency of the oscillating element 2, adjusting the frequency of the oscillating element 2, stabilizing the frequency characteristic of the oscillating element 2, and sealing the oscillating element 2 (corresponding to Steps #2–#7 in FIG. 6, respectively), the necessary operations are performed for the first unit 110 only. In the steps of mounting an IC chip 3 and filling resin in a cavity (corresponding to Steps #9 and #10 in FIG. 6, respectively), the necessary operations are performed for the second unit 120 only. Subsequently, the first unit 110 and the second unit 120 are integrated by conductive adhesive 130 into a single body. Thereafter, temperature compensation data is written in the IC chip 3 (corresponding to Step #11 in FIG. 6).

This manufacturing method is more economical since it is sufficient to throw only the first unit 110 away when the crystal oscillating element 2 has a problem. Furthermore, since the IC chip 3 is never subjected to any heat treatment performed for the first unit 110, reliability can be further improved.

Figure 8:
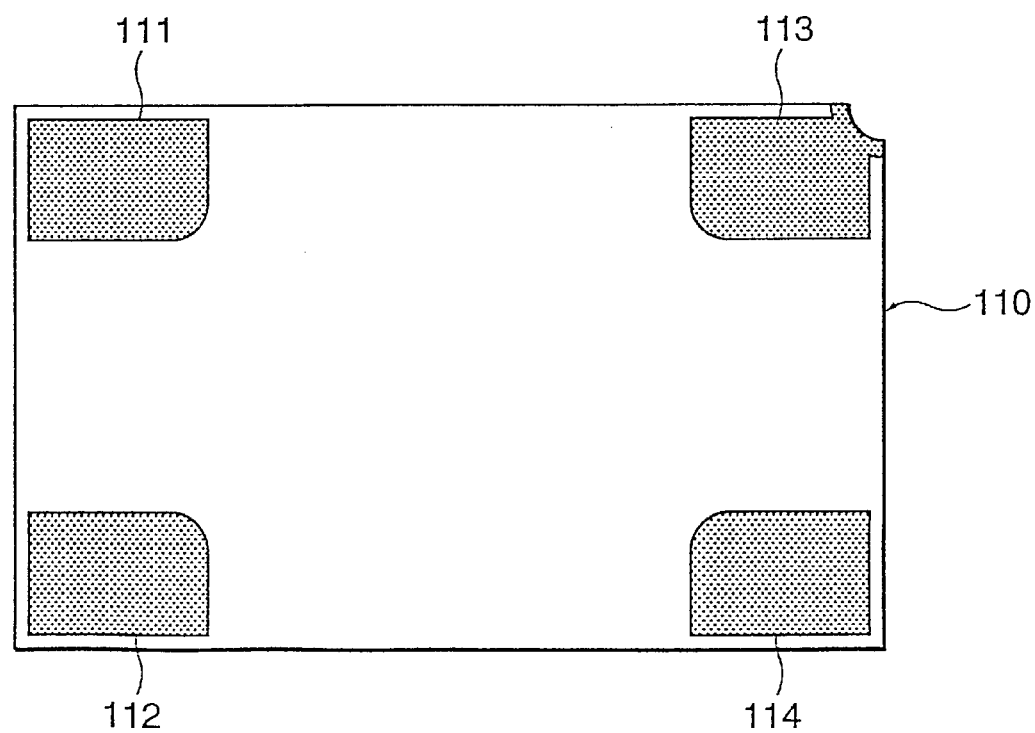
FIG. 8 is a bottom plan view of a first unit of the crystal oscillator shown in FIG. 7.

Referring to FIG. 8 showing a bottom view of the first unit 110, the first unit 110 includes a plate-like insulating layer 100b made of ceramics and a surrounding insulating layer 100a made of ceramics to define a space 115 for accommodating the crystal oscillating element 2. On the bottom surface of the first unit 110, i.e., the bottom surface of the plate-like insulating layer 100b, is formed with four connection electrodes 111 to 114.

The connection electrodes 111, 112 are connected with the crystal oscillating element 2 to allow an output signal of the crystal oscillating element 2 to send out. Also, the connection electrodes 111, 112 are used to measure the oscillating characteristic of the crystal element 2. The connection electrodes 113, 114 are used to place at ground potential a seam member 36 provided on the top of the surrounding layer 100a on the first unit 110.

Figure 9:
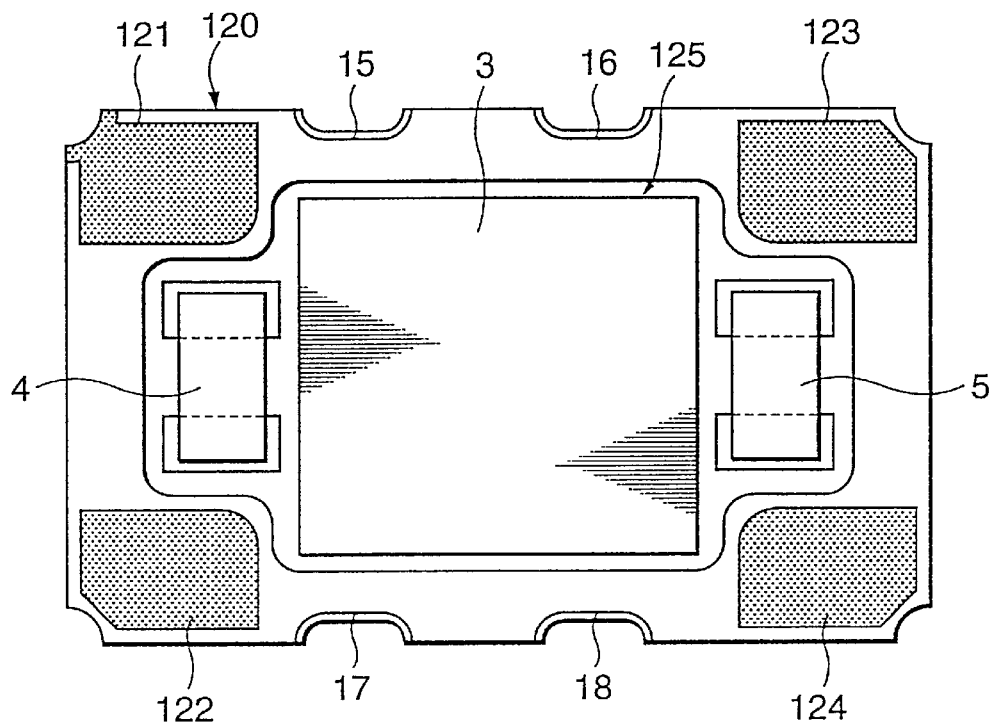
FIG. 9 is a top plan view of a second unit of the crystal oscillator shown in FIG. 7.
Figure 10:
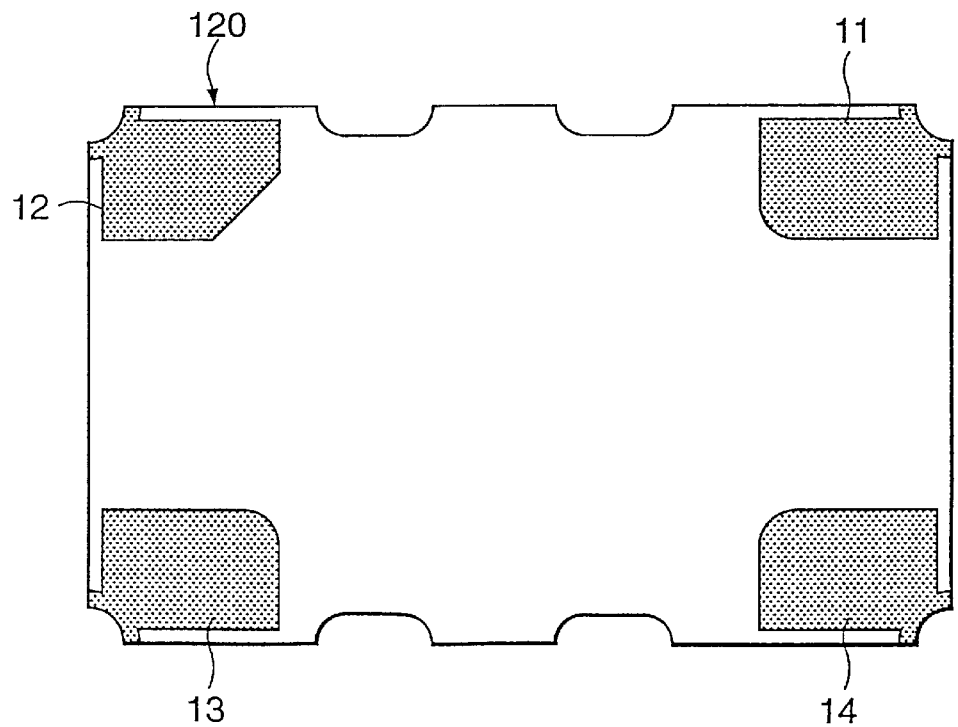
FIG. 10 is a bottom plan view of the second unit of the crystal oscillator shown in FIG. 7.
Figure 11:
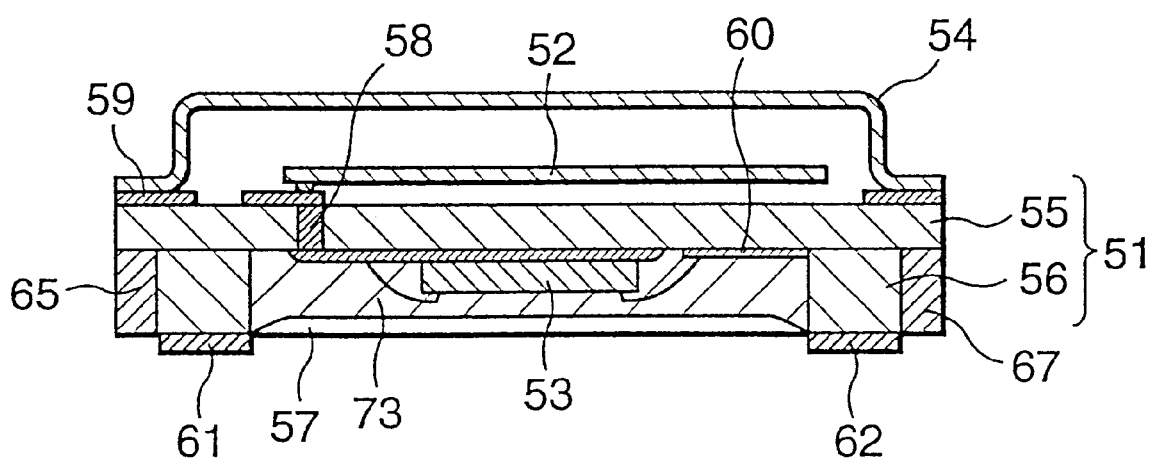
FIG. 11 is a sectional view of a conventional temperature compensating crystal oscillator.
Figure 12:
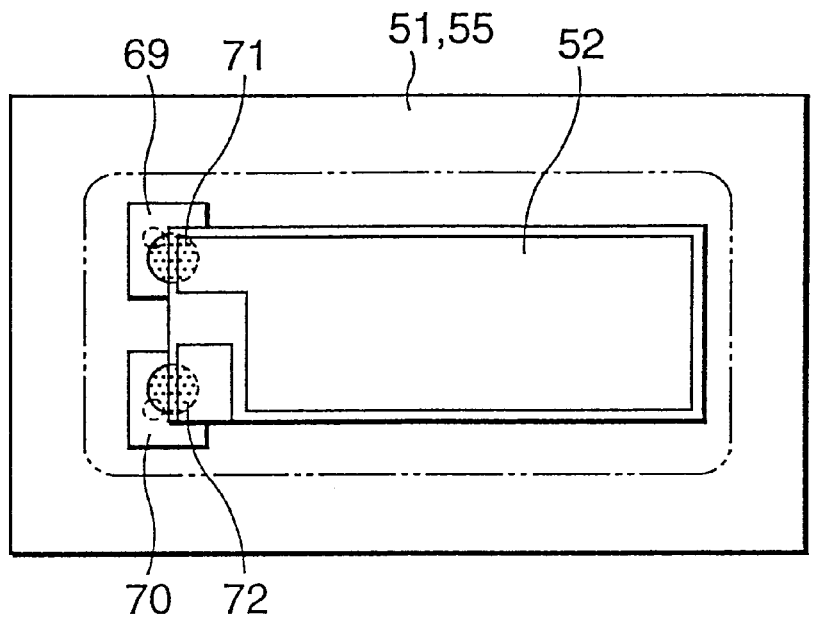
FIG. 12 is a top plan view of the conventional crystal oscillator without a cover thereof.
Figure 13:
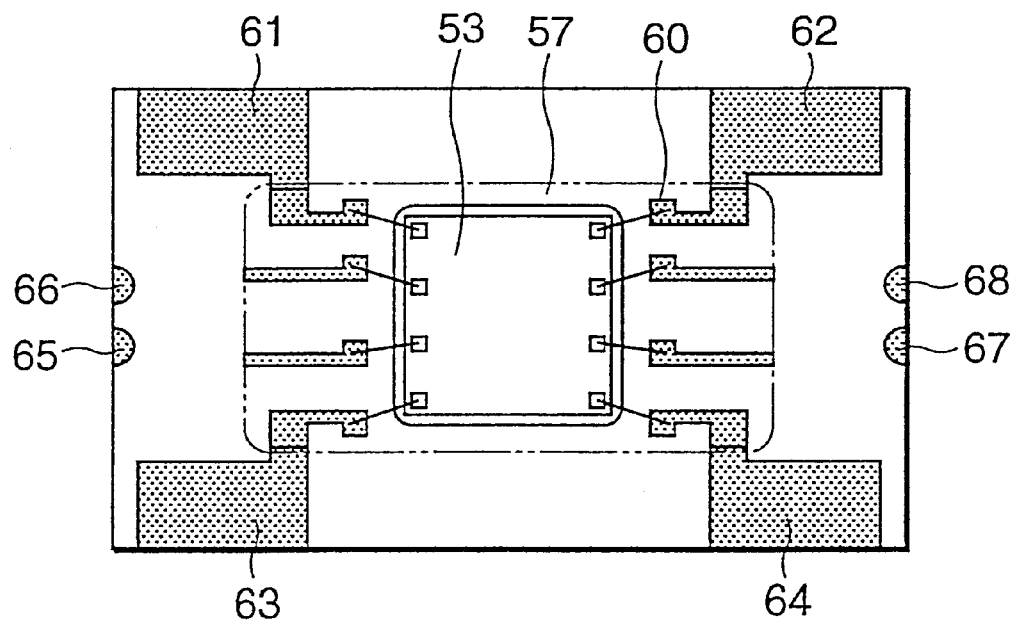
FIG. 13 is a bottom plan view of the conventional crystal oscillator.

FIG. 9 shows a top view of the second unit 120, and FIG. 10 shows a bottom view of the second unit 120. The second unit is constructed by a ceramic insulating layer 100c having a space and a plate-like ceramic insulating layer 100d. The space of the insulating layer 100c and the plate-like insulating layer 100d defines a cavity 125 for accommodating an IC chip 3 and electronic devices 4, 5. In this crystal oscillator, the cavity 125 for accommodating the IC chip 3 and the electronic devices 4, 5 is opened to above.

The second unit 120 is formed with connection electrodes 121 to 124 around the cavity 125 on the top surface thereof. Further, the second unit 120 is formed with terminal electrodes, i.e., OUT terminal electrode 11, VCC terminal electrode 13, GND terminal electrode 13, and VCON terminal electrode 14.

Further, the ceramic insulating layer 100c is formed with four recesses in the opposite longer sides thereof. IC control terminal electrodes 15 to 18 are formed on inner walls of the recesses.

The first unit 110 and the second unit 120 are electrically connected with each other by conductive connectors 130. Specifically, the connection electrodes 111 and 112 of the first unit 110 are electrically connected with the connection electrodes 123 and 124 of the second unit 120 by the conductive connectors 130. Thereby, the crystal oscillating element 2 is electrically connected with the IC chip 3 by the way of the connection electrodes 111, 112 of the first unit 110, and the connection electrodes 123, 124, a conductive path, IC electrode pad (not shown) of the second unit 120. Also, the connection electrodes 113, 114 of the first unit 110 are electrically connected with the connection electrodes 121, 122 of the second unit 120, and thereby connected with the IC chip 3, or the GND terminal electrode 13 by the way of the connection electrodes 121, 122 and a conductive path of the second unit 120.

The IC chip 3 is electrically connected with the IC control terminal electrodes 15 to 18 by the way of a conductive path formed in the second unit 120, and connected with the external terminal electrodes 11 to 14 by the way of the electronic devices or capacitors 4, 5.

In the crystal oscillator shown in FIGS. 1 to 5, the conductive path including the viahole conductors 25, 27 and the conductive thin layer of the internal wiring conductor 29 for connecting the conductors 25, 27 is formed in and between the ceramic insulating layers 1a, 1b. The viahole conductors 25, 27 are formed in different positions with respect to the plane direction of the insulating layers 1a, 1b and connected by the internal wiring conductor 29 which is formed to extend in the plane direction of the insulating layers 1a, 1b, thereby constructing a bent or bypass circuit. Accordingly, even if crack or peeling would occur in the ceramic insulating layers around the viahole conductors 25, 27, the ceramic insulating layers 1a, 1b are hermetically joined together in the area where the internal wiring conductor 29 is formed. Thus, there is no likelihood that the hermetic space where the crystal oscillating element 2 is accommodated communicates with the cavity 10 via the portions around the viahole conductors 25, 27. As a result, the crystal oscillator is allowed to stably operate without the oscillation characteristic thereof largely changing at all.

By suitably changing the shape of the internal wiring conductor 29 between the insulating layers, the viahole conductor 25 which is exposed only at the top surface of the main body 1 and the viahole conductor 27 which is located in the position different from the viahole conductor 25 and exposed at the cavity 10 can be formed in freely set positions. In other words, the viahole conductor 25 exposed only at the top surface may be formed right below the electrode pads 20 to which the crystal oscillating element 2 is electrically connected, whereas the viahole conductor 27 exposed only at the ceiling surface of the cavity 10 may be extended directly to the specified IC electrode pad 32. This will simplify the construction of the wiring conductor 31 on the ceiling surface of the cavity 10.

Further, the viahole conductors 25 are formed right below and in proximity to the electrode pads 20, 21 to which the crystal oscillating element 2 is electrically connected. Accordingly, the exposure or presence of the conductive parts in the hermetic space for accommodating the crystal oscillating element 2 can be suppressed to minimum. This prevents the characteristic of the crystal oscillating element 2 from being changed due to foreign matter brought about from the conductive parts.

Furthermore, an inverter for the oscillating circuit may be integrated on the IC chip 3 in addition the control circuit for the temperature compensation. Furthermore, the electronic devices 4, 5, or resistors or large capacity capacitors which are difficult to be integrated into the IC chip 3 may be arranged on the printed circuit board without being arranged in the main body 1. The resin 7 may be a single layer. In this case, epoxy resin or silicone resin may be used. Furthermore, the conductive paste is cured by heat curing, ultraviolet curing or like known curing method.

As this invention may be embodied in several forms without departing from the spirit of essential characteristics thereof, the present embodiment is therefore illustrative an not restrictive, since the scope of the invention is defined by the appended claims rather than by the description preceding them, and all changes that fall within metes and bounds of the claims, or equivalence of such metes and bounds are therefore intended to embraced by the claims.

What is claimed is:

1. A crystal oscillator comprising:

an insulating main body having a top surface, a bottom surface, and a side surface, the insulating main body being formed with:

an upper space in an upper portion thereof, a first inner wall defining the upper space, the first inner wall provided with first electrode pads; and a lower space in a lower portion thereof, a second inner wall defining the lower space, the second inner wall provided with second electrode pads;

a crystal oscillating element disposed in the upper space, electrically connected with the first electrode pads;

an IC chip disposed in the lower space, electrically connected with the second electrode pads for compensating the temperature-frequency variation characteristic of the crystal oscillating element;

IC control terminal electrodes provided on a side of the insulating main body, both upper and lower ends of the IC control terminal electrodes spaced apart from the top and bottom surfaces of the insulating main body electrically connectable with the second electrode pads;

external terminal electrodes disposed on the bottom surface of the insulating main body, connectable with a wiring conductor of a printed circuit;

a cover provided on the top surface of the insulating main body for hermetically sealing the upper space; and a conductive path disposed within the main body for connecting the first electrode pads with the second electrode pads, the conductive path including a first via hole connected with the first electrode pads and extending in a depth direction along a first line, a second via hole conductor connected with the second electrode pads and extending in a depth direction along a second line offset from the first line, and an internal wiring conductor extending along a width of the main body connecting the first via hole conductor and the second via hole conductor.

2. A crystal oscillator according to claim 1, wherein the insulating main body is formed with recesses in the side thereof, and the IC control terminal electrodes are disposed on an inner wall of each recess.

3. A crystal oscillator according to claim 1, wherein the main body is formed of a plurality of insulating layers stacked one top of another, and is provided with an internal wiring conductor between the insulating layers and a lower wiring conductor on a ceiling surf ace of the lower space, and the second electrode pads connected with the IC chip and the IC control terminal electrodes are electrically connected by the internal wiring conductor and the lower wiring conductor.

4. A crystal oscillator according to claim 3, wherein the main body is further provided with viahole conductors extending in a thickness direction of the insulating layers, and the first electrode pads connected with the oscillating element and second electrodes connected with the IC chip are electrically connected by the viahole conductors and the internal wiring conductor.

5. A crystal oscillator according to claim 1, wherein the external terminal electrodes are formed at four corners of the bottom surface of the main body.

6. A method for manufacturing a crystal oscillator, comprising the steps of:

preparing a main body including an upper space portion having oscillating element electrode pads, a lower space portion having IC electrode pads, and conductors for connecting the oscillating element electrode pads and the IC electrode pads, said conductors comprising a first via hole connected with the oscillating element electrode pads and extending in a depth direction along a first line, a second via hole conductor connected with the IC electrode pads and extending in a depth direction along a second line offset from the first line, and an internal wiring conductor extending along a width of the main body connecting the first via hole conductor and the second via hole conductor, and IC terminal electrodes on a side thereof, and external terminal electrodes on a bottom thereof;

electrically connecting a crystal oscillating element with the oscillating element electrode pads via conductive adhesive;

measuring an oscillating frequency variation characteristic of the crystal oscillating element for frequency adjustment;

hermetically sealing the upper space portion in which the crystal oscillating element is mounted;

electrically connecting an IC chip with the IC electrode pads; and writing the IC chip temperature compensation data for flattening the temperature-frequency variation characteristic of the crystal oscillating element via the IC control terminal electrodes.

7. A method according to claim 6, further comprising, before the step of writing the temperature compensation data, the step of filling resin in the lower space portion to protect the IC chip.

8. A method according to claim 6, further comprising, before the step of connecting the IC chip with the IC electrode pads, the step of cleaning the IC electrode pads.

9. A method according to claim 6, where the temperature compensation data is operable to define a function which flattens a temperature-frequency variation characteristic obtained based on frequency measurements within a predetermined temperature range.

10. A method for manufacturing a crystal oscillator, comprising the steps of:

preparing a first unit and a second unit, the first unit including a first space portion in an upper portion thereof, the first space portion having oscillating element electrode pads, and connection electrodes on a bottom surface thereof, the connection electrodes having an electrical connection with the oscillating element electrode pads, said electrical connection comprising a first via hole connected with the oscillating element electrode pads and extending in a depth direction along a first line, a second via hole conductor connected with the connection electrodes and extending in a depth direction along a second line offset from the first line, and an internal wiring conductor extending along a width direction connecting the first via hole conductor and the second via hole conductor, the second unit including a second space portion in an upper portion thereof, the second space portion having IC electrode pads, and connection electrodes around an opening of the second space portion on a opt surface thereof and IC control terminal electrodes on a side thereof;

electrically connecting a crystal oscillating element with the oscillating element electrode pads via conductive adhesive;

measuring an oscillating frequency variation characteristic of the crystal oscillating element for frequency adjustment;

hermetically sealing the first space portion of the first space portion;

electrically connecting an IC chip with the IC electrode pads;

placing the first unit on the top of the second unit in such a manner that the first unit covers the second space portion of the second unit, and the connection electrodes of the first unit electrically join with the connection electrodes of the second unit; and writing the IC chip temperature compensation data for flattening the temperature-frequency variation characteristic of the crystal oscillating element via the IC control terminal electrodes.

11. A method according to claim 10, further comprising, before the step of writing the temperature compensation data, the step of filling resin in the lower space portion to protect the IC chip.

12. A method according to claim 10, further comprising, before the step of connecting the IC chip with the IC electrode pads, the step of cleaning the IC electrode pads.

13. A method according to claim 10, where the temperature compensation data is operable to define a function which flattens a temperature-frequency variation characteristic obtained based on frequency measurements within a predetermined temperature range.

* * * * *